(12) United States Patent
Devos et al.

(10) Patent No.: US 7,757,631 B2
(45) Date of Patent: Jul. 20, 2010

(54) APPARATUS FOR FORMING A CIRCUIT

(75) Inventors: John A. Devos, Corvallis, OR (US); Daniel R. Blakley, Philomath, OR (US); Ravi Prasad, Corvallis, OR (US); Olan Way, Eugene, OR (US); Jian-gang Weng, Corvallis, OR (US); Jeffrey A. Nielsen, Corvallis, OR (US); Tony S. Cruz-Uribe, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1350 days.

(21) Appl. No.: 10/854,450

(22) Filed: May 26, 2004

(65) Prior Publication Data

US 2005/0266154 A1    Dec. 1, 2005

(51) Int. Cl.
*B05C 5/00* (2006.01)
*B05C 11/00* (2006.01)
*B05B 7/00* (2006.01)
*B05B 5/00* (2006.01)
*B41J 29/38* (2006.01)

(52) U.S. Cl. ............... 118/665; 118/688; 118/641; 118/642; 118/58; 118/300; 347/9

(58) Field of Classification Search ............... 118/688, 118/679, 665, 680, 58, 62, 63, 641, 642, 118/300, 313, 46, 643, 314–315, 302, 682; 427/542, 96.1, 258, 372.2; 347/9, 12, 107, 347/1, 2, 68, 200; 438/647

See application file for complete search history.

(56) References Cited

U.S. PATENT DOCUMENTS

| | | | |
|---|---|---|---|
| 4,940,623 A | | 7/1990 | Bosna et al. |
| 5,114,744 A | | 5/1992 | Cloutier et al. |
| 5,876,615 A | | 3/1999 | Predetechensky |
| 5,891,528 A | | 4/1999 | Turek et al. |
| 6,021,050 A | | 2/2000 | Ehman et al. |
| 6,076,723 A | | 6/2000 | I-Tsung Pan |
| 6,224,180 B1 | | 5/2001 | Pham-Van-Diep et al. |
| 6,251,488 B1 | | 6/2001 | Miller et al. |
| 6,491,969 B2 | | 12/2002 | Eldridge |
| 6,503,831 B2 | | 1/2003 | Speakman |
| 6,527,843 B1 | | 3/2003 | Zaima et al. |
| 6,641,860 B1 | | 11/2003 | Kaiserman et al. |
| 6,645,569 B2 | | 11/2003 | Cramer et al. |
| 2003/0008429 A1* | | 1/2003 | Yamazaki et al. ............ 438/30 |
| 2003/0010283 A1* | | 1/2003 | Yamazaki et al. ............ 118/56 |
| 2003/0059987 A1 | | 3/2003 | Sirringhaus et al. |
| 2003/0117476 A1* | | 6/2003 | Cross et al. ................. 347/107 |

OTHER PUBLICATIONS

Sawyer B. Fuller et al., "Ink-Jet Printed Nanoparticle Microelectromechanical Systems," Journal of Microelectromechanical Systems, vol. 11. No. 1, Feb. 2002.

* cited by examiner

*Primary Examiner*—Yewebdar T Tadesse

(57) ABSTRACT

Methods and apparatuses for forming components or circuits by ejecting a fluid including materials in a single ligament are disclosed.

88 Claims, 13 Drawing Sheets

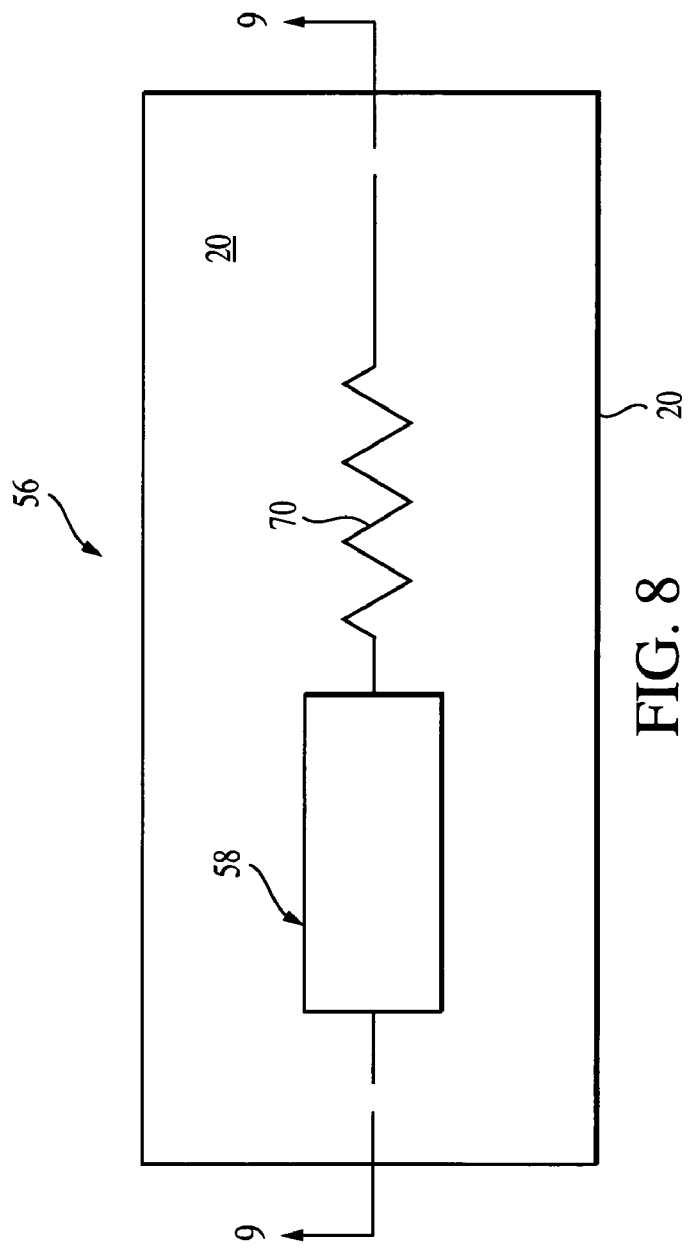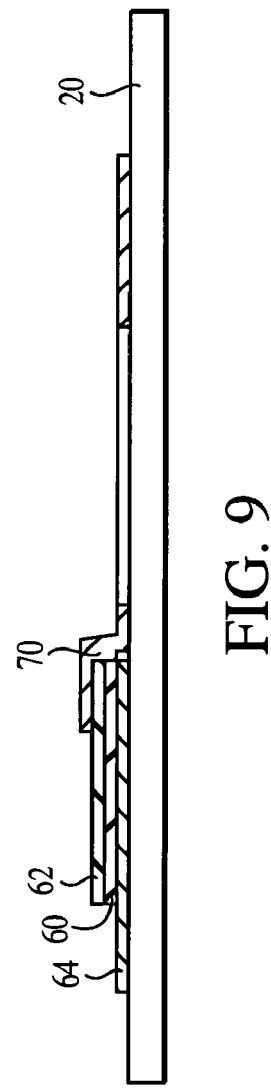

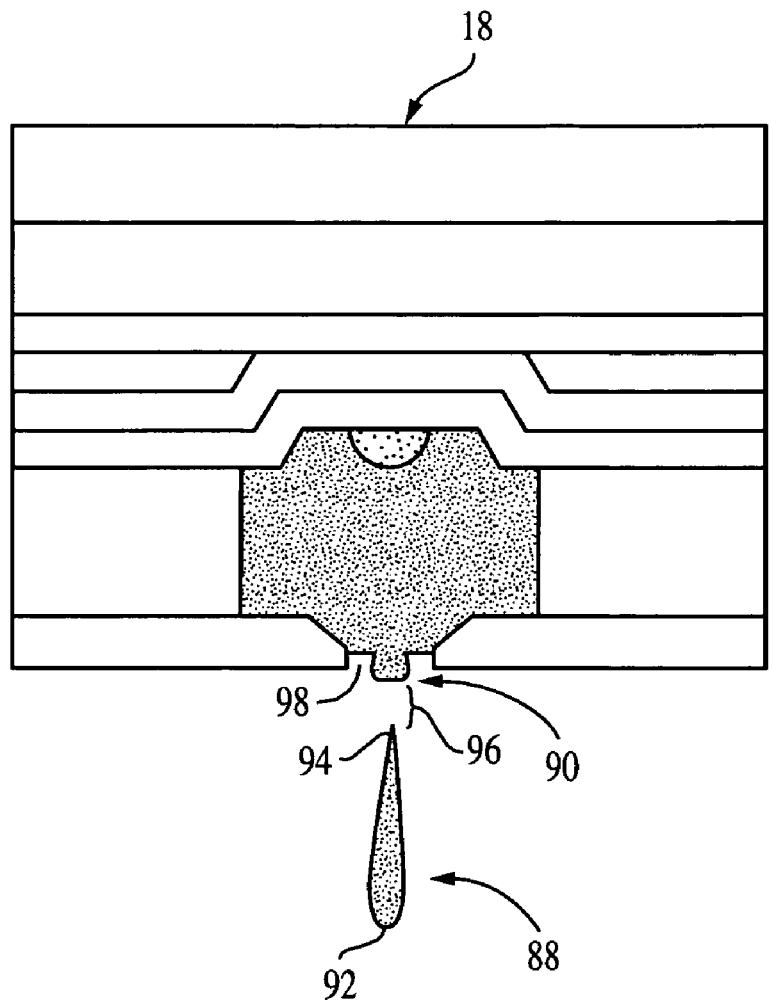
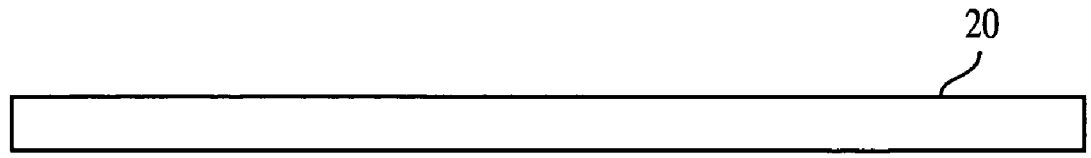
FIG. 14

APPARATUS FOR FORMING A CIRCUIT

BACKGROUND

Circuits may be fabricated on flexible and rigid media by additive and subtractive processes using etched aluminum or other metals. The subtractive process completes patterning of material. Screen-printing is also used to make fixed patterns in the formation of circuits. These fabrication techniques may contribute significantly to the cost of circuits formed by these techniques.

BRIEF DESCRIPTION OF THE DRAWINGS

FIG. 8 is a plan view of an embodiment of a printed RC circuit fabricated in accordance with an embodiment of the invention;

FIG. 9 is a schematic cross-section of the circuit of FIG. 8 along line 9-9;

FIGS. 13-16 are simplified diagrams illustrating an embodiment of a process for forming a single ligament of fluid in accordance with an embodiment of the present invention.

DETAILED DESCRIPTION OF THE DRAWINGS

Figure 1:
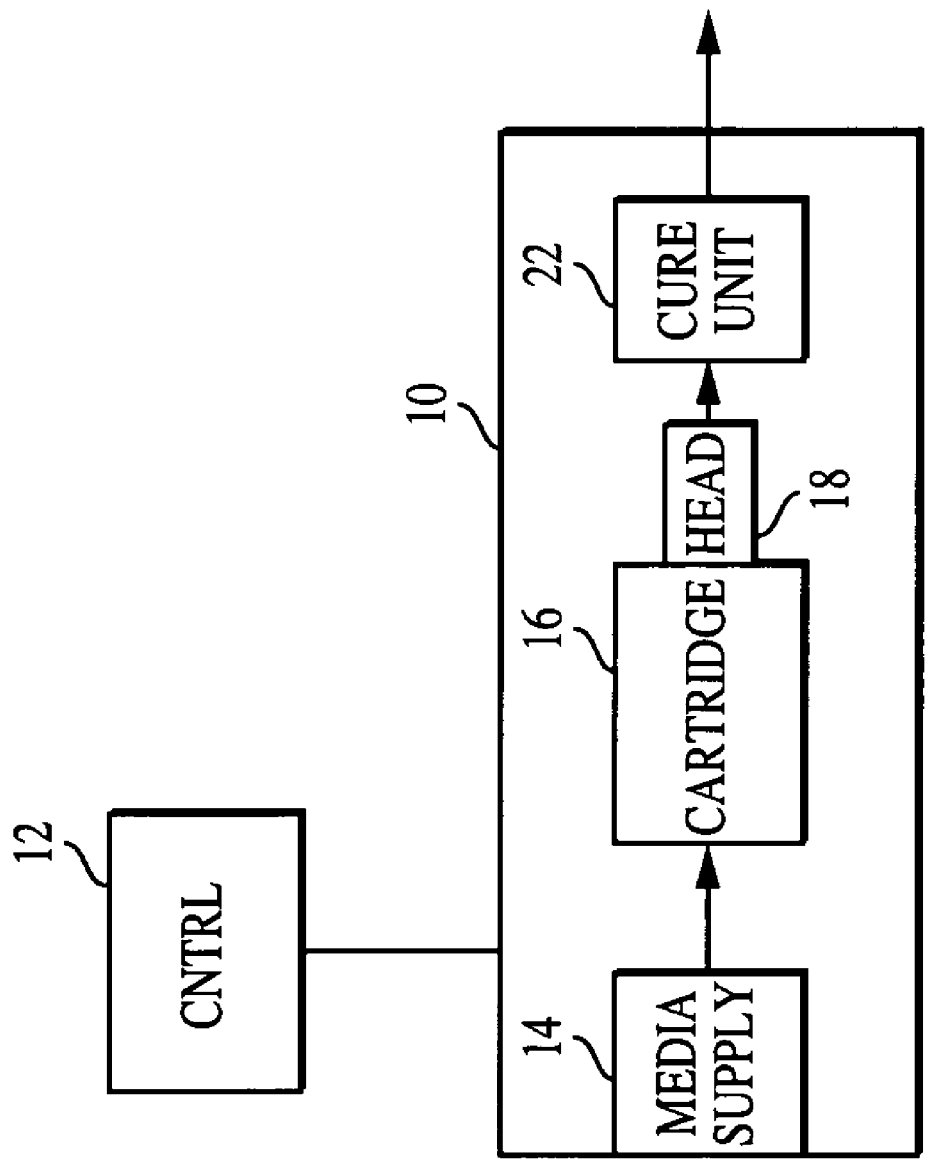
FIG. 1 is a block diagram of an embodiment of a system for fabricating circuits in accordance with an embodiment of the present invention.

The disclosed subject matter concerns printing of circuits using inkjet printers. Conductive metal particles, nanoparticles or polymers, insulating or dielectric materials, or resistive materials are suspended in print fluid and ejected from a print head and deposited onto a flexible or rigid media in desired patterns to form the components of the circuit. The circuit components are then heated to sinter the suspended materials, or drive off, i.e., evaporate or dry, print fluid from polymers, insulating or dielectric and resistive material.

Embodiments of inkjet printers for fabricating circuits will now be illustrated. In the description, particular exemplary devices and device applications will be used for purposes of illustration, but the embodiments of the invention are not limited to the formation of the particular illustrated devices. Dimensions and illustrated devices may be exaggerated for purposes of illustration and understanding of the embodiments. Reference numerals may be used in different embodiments to indicate similar features. The elements of the drawings are not necessarily to scale relative to each other. Rather, emphasis has instead been placed upon clearly illustrating the embodiments of the invention. A device illustrated by a two-dimensional schematic layer structure will be understood by artisans to provide teaching of three-dimensional device structures and integrations.

FIG. 1 is an embodiment of a system for printing a circuit, and includes an inkjet printer 10 connected to a controller 12. The controller 12 can be a desktop personal computer or any form of CPU for operating an inkjet printer 10. It should be understood that while the controller 12 is shown as a separate component from the inkjet printer 10, it can be a part of a firmware or software programmed in the inkjet printer 10 itself.

Figure 2:
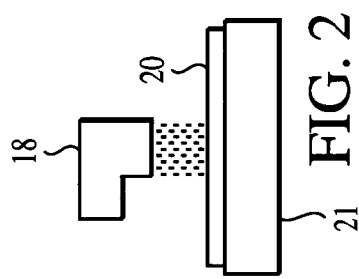
FIG. 2 is a diagram illustrating an embodiment of deposition of print fluid onto a substrate by a print head shown in FIG. 1.

The inkjet printer 10 can either be a thermal or a piezoelectric inkjet printer, and includes a print media supply 14 for providing a substrate 20 on which the circuit is to be printed (best shown in FIG. 2). The substrate 20 can be any printable material typically used in fabricating circuits, for example, a flexible media such as paper or plastic, or a rigid media such as glass. The inkjet printer 10 also includes an inkjet print cartridge 16 including a print head 18, which operates to eject print materials suspended in print fluid from the print cartridge 16 onto the substrate 20 (shown in FIG. 2 on a platen 21) for forming the pattern of the circuit.

In a thermal inkjet printer, print fluid is ejected by rapidly heating a resistor area in the print head 18, thereby causing print fluid in a fluid chamber to vaporize and expand in volume. The fluid displaced by that expansion ejects print fluid out of an orifice onto the print media. Inkjet printers 10 that utilize piezoelectric technology employ a print head 18 including a piezoelectric transducer which is coupled to a flexible diaphragm in the fluid chamber. Together the piezoelectric transducer and the flexible diaphragm form a controllable actuator for squeezing the fluid chamber in the print head 18, thereby ejecting fluid out of an orifice and onto the substrate 20.

The materials in the print fluid may be particles, such as in one embodiment nanoparticles, of any conductive metals such as silver, copper, nickel, aluminum, gold, etc., conductive polymers such as PEDOT and polyaniline, insulating or dielectric materials such as polyvinyl pyrrolidone or polyvinyl phenol, or resistive materials such as carbon particles. Print fluid may be alpha-terpineol mixed with ethanol or toluene, for example.

A cure unit 22 heats the substrate 20 deposited with print fluid to drive off or evaporate the fluid and sinter the nanoparticles and form conductive bonds or, when the materials in print fluid are conductive polymers, insulating-dielectric materials or resistive materials, to drive off or evaporate print fluid in which these materials are suspended. The heat for heating or curing the deposited substrate 20 can be supplied by any heat source such as a convection oven, laser energy, microwave energy, direct infrared source, etc. Depending on the type of nanoparticles being used, the printed substrate may be heated to a temperature of approximately 150° C. to 300° C., for example, for approximately 60 to 300 seconds in order to sinter the metal nanoparticles. For the purpose of evaporating print fluid, the printed substrate may be heated to a temperature of approximately 80° C. to 150° C., for example, for approximately 60 to 300 seconds.

Figure 3:
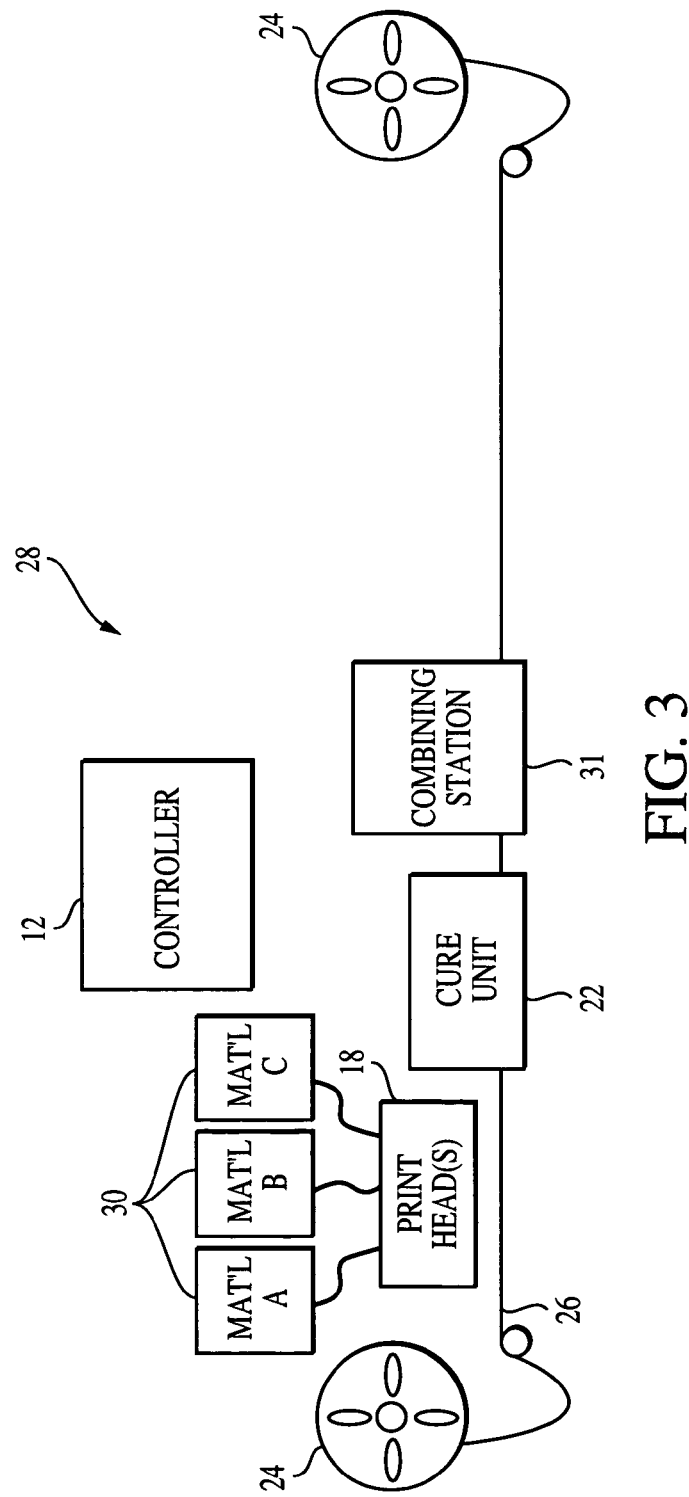
FIG. 3 is a diagram of an embodiment of a system for fabricating circuits in accordance with another embodiment of the present invention.

It should be understood that while the cure unit 22 and the media supply 14 are shown to be provided within the inkjet printer 10, they can be separate components from the inkjet printer, as shown in FIG. 3. In FIG. 3 and in accordance with another exemplary embodiment of the invention, a front reel 24 supplies the print media or substrate 20, which forms a web 26 in a circuit web system 28. In the web system 28, print fluid containing different print materials is supplied from a plurality of fluid tanks 30. In this embodiment, the controller 12 operates the entire web system 28, in addition to the task of controlling the circuit fabricating functions.

In operation, as the substrate 20 is released from the front reel 24, it passes under a print head 18 or a series of print heads (best shown in FIG. 2), and is deposited with materials in print fluid contained in the fluid tank 30 as dictated by the controller 12. The substrate 20 then moves into a cure unit 22 where the materials deposited are heated to be sintered and/or to evaporate print fluid from the printed materials.

For metal nanoparticles, such as copper, that may oxidize in air in a way that is detrimental for good conduction, an inert atmosphere can be used to eliminate or reduce the oxide. The final device can also have a passivation layer (not shown) printed or otherwise coated over it to avoid oxidation once removed from the inert atmosphere. For some metals, such as silver or gold, a passivation layer may not be used and therefore the processing can be simplified.

For lower melting or burning point substrates 20, laser or microwave curing may be used, or a conductive nanoparticle solution utilizing a reactive organic medium that exothermically degrades at lower temperatures (such as the lower temperature curing silver solution from Parelec, Inc.) can be used to sinter particles without damaging the substrate, or a dielectric material, if a lower temperature dielectric or insulator is chosen.

The web system 28 may also include a combining station 31 where printed circuits fabricated in accordance with the embodiments of the invention can be combined in any manner with other electrical components such as a microchips or other component surface mount electrical devices (not shown) for building low cost "hybrid" circuits.

Figure 4:
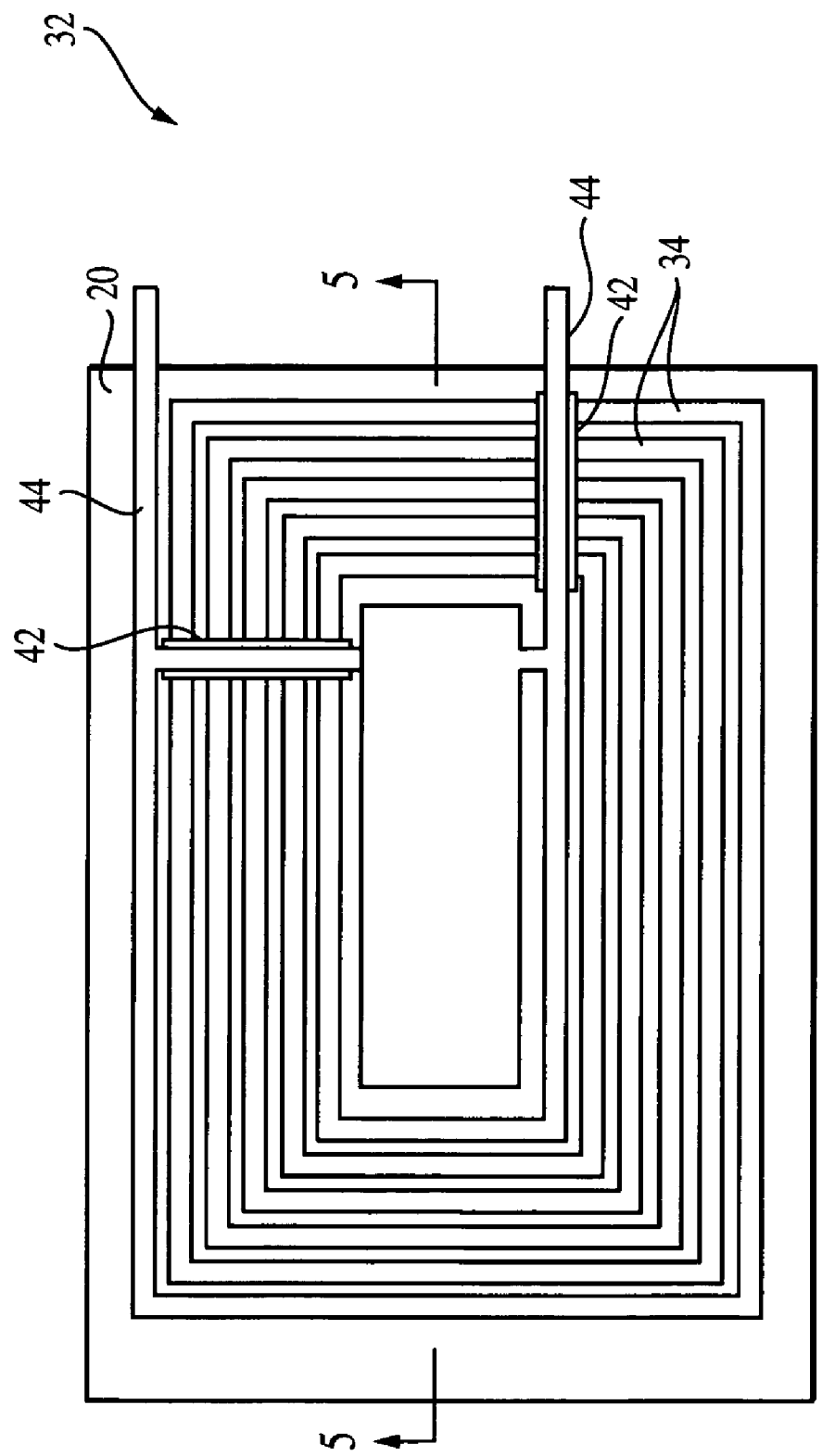
FIG. 4 is a plan view of an embodiment of a printed RF resonant circuit fabricated in accordance with an embodiment of the present invention.
Figure 5:
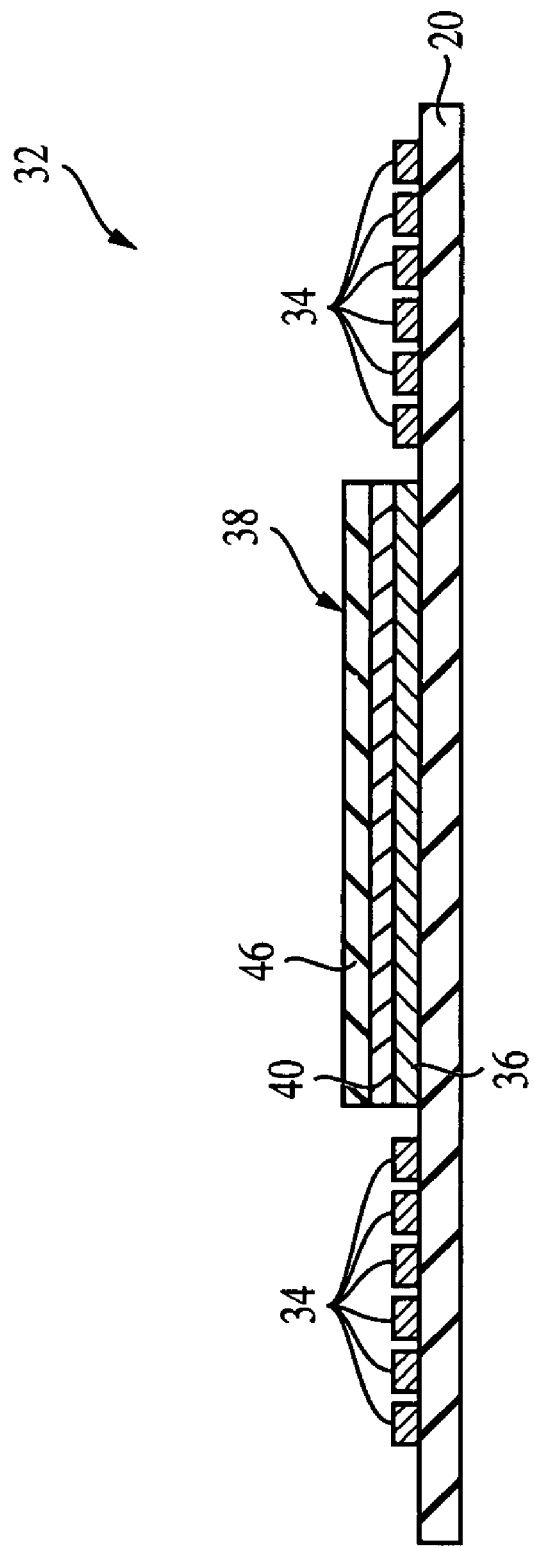
FIG. 5 is a schematic cross-section of the circuit of FIG. 4 along line 5-5.

FIGS. 4 and 5 show a radio frequency (RF) resonant circuit 32. RF resonant circuits may be used in a variety of applications, including electronic article surveillance sensors in merchandise packaging, radio frequency identification tags, communication devices, etc.

Initially, conductive metal nanoparticles such as silver, copper, nickel, aluminum, gold, etc., suspended in print fluid such as alpha-terpineol mixed with ethanol or toluene are ejected by the print head 18 (best shown in FIG. 1) from an ink cartridge 16 or fluid tanks 30 (shown in FIG. 3) onto the substrate 20, which can be flexible media such as paper or plastic, or rigid media such as glass.

The metal nanoparticles are deposited in a pattern to form a radio frequency coil 34 and a first or bottom electrode 36 of a capacitor 38. The deposited nanoparticles are cured or heated at a temperature of approximately 220° C. (for the higher temperature curing silver solutions, for example) to sinter them together and form conductive bonds. As discussed above, the heat source can be a convection oven, laser energy, microwave energy, direct infrared source or others. For lower melting or burning point substrates 20, laser or microwave curing may be used, or a conductive nanoparticle solution utilizing a reactive organic medium that exothermically degrades at lower temperatures, such as, for example, the lower temperature curing silver solution from Parelec, Inc., can be used to generate particle sintering without damaging the substrate 20.

Next, an insulating or dielectric material, such as polyvinyl pyrrolidone (PVP), is deposited by the print head 18 from the print fluid cartridge 16 containing n-methyl pyrrolidone (NMP) as the dielectric 40 for the capacitor 38, over the first or bottom electrode 36 of the capacitor. The insulating or dielectric material is also deposited over a portion of the coil 34 to act as an insulating bridge 42 across the coil for the capacitor lead 44 to avoid shorting. The components on the substrate 20 are then subjected to another heating process to cure the dielectric 40 and the bridge 42. The heating process and temperature to cure the dielectric material can be the same as that used for the lower temperature silver.

The RF circuit 32 is completed by using the print head 18 to deposit another layer of conductive metal nanoparticles from the print fluid cartridge 16 (or a fluid tank 30), over the dielectric 40 to form the second or top electrode 46. Two capacitor leads 44 are also deposited over the insulating bridge 42 to connect to the top and bottom electrodes 46, 36. The second electrode 46 and the capacitor leads 44 are then cured as described above. If a convection heating source is used for curing, then a lower temperature sintering metal nanoparticle solution should be used to avoid damage to the dielectric 40. Those skilled in the art will recognize that the factors which determine the capacitance of the RF circuit include, for example, the dielectric constant of the dielectric material, the thickness of the dielectric, the surface area of the electrodes and the width, separation, and length of the coil traces.

Figure 6:
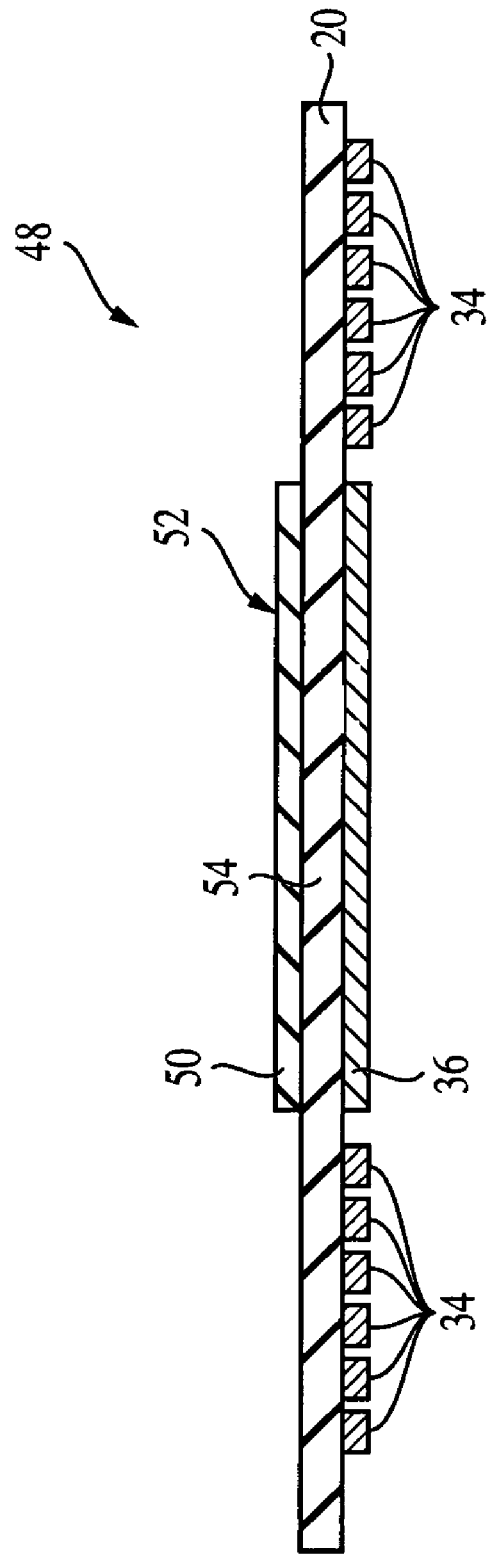
FIG. 6 is a schematic cross-section of an embodiment of a RF resonant circuit fabricated in accordance with another embodiment of the present invention.

Turning now to FIG. 6, and in accordance with another exemplary embodiment of the present invention, an RF resonant circuit 48 is fabricated by inkjet printing both sides of the substrate 20, and using the substrate as the dielectric of a capacitor. In this embodiment, the first or bottom electrode 36 and the coil 34 are formed on one side of the substrate 20 as described above. Simultaneous to this step, or in a subsequent step, the second or a top electrode 50 of a capacitor 52 is formed on the opposite side of the substrate 20 from the first electrode 36, causing the substrate 20 to act as the dielectric 54 for the capacitor. As with the other components of the RF resonant circuit 48, the second electrode 50 is also deposited on the substrate 20 by ejecting metal nanoparticles as described above.

In FIG. 6, both the first and the second electrodes 36, 50 are shown to be approximately the same size and generally aligned with respect to each other. It should be understood, however, that the first and the second electrodes 36, 50 may be of different sizes or areas, and/or be offset from each other to provide additional variables in controlling the resulting capacitance. Also, if the second electrode 50 is formed subsequent to the first electrode 36, an additional heating step may be used to sinter the nanoparticles in the second electrode 50. Traces (not shown) can also be provided from the RF resonant circuit 48 to connect with other electronic devices or circuits that may use the energy absorbed by the RF resonant circuit.

It should be appreciated that printing the capacitor electrodes 36, 50 on both sides of the substrate 20 so that it acts as the capacitor's dielectric, allows fabrication of the capacitor without an additional insulator or dielectric printing step. In addition, using the substrate 20 itself as the capacitor's dielectric allows for the RF resonant circuit 48 to operate at lower frequencies than if all the capacitor electrodes were printed on the same side of the substrate, for example, as in an interdigitated high frequency capacitor.

Figure 7:
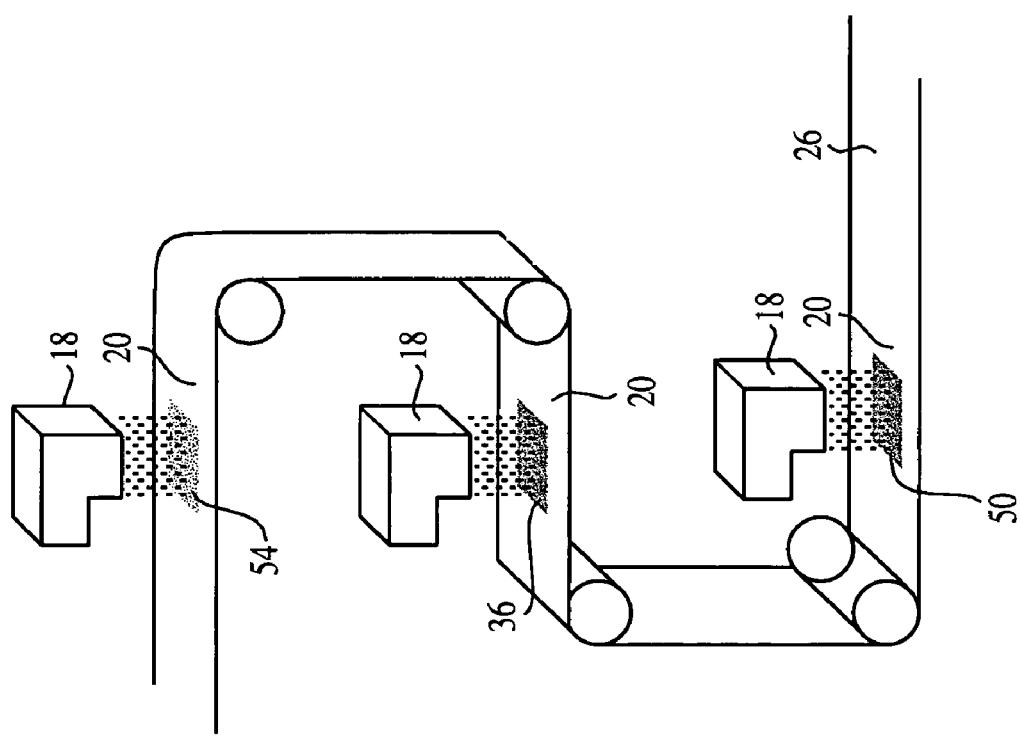
FIG. 7 is a diagram illustrating an embodiment of a fabrication process of a capacitor employing the print medium as the dielectric in accordance with an embodiment of the present invention.

In accordance with another exemplary embodiment of the present invention shown in FIG. 7, in capacitors with electrodes 36, 50 formed on both sides of the substrate 20, the capacitance or the insulating property of the dielectric 54 can be increased by injecting the portion of the substrate 20 with print fluid containing insulating or dielectric material such as PVP, prior to the formation of the electrodes 36, 50, so that the material absorbs into the substrate 20. Alternatively, the insulating or dielectric material can also be deposited or printed on one or both sides of the portion of the substrate that form the capacitor 48, as well, to increase capacitance. The factors that control absorption of the insulating or dielectric material into the substrate onto the surface of the substrate include dielectric particle size, substrate porosity, and contact angle and wettability between the substrate and the printing fluid.

Figure 10:
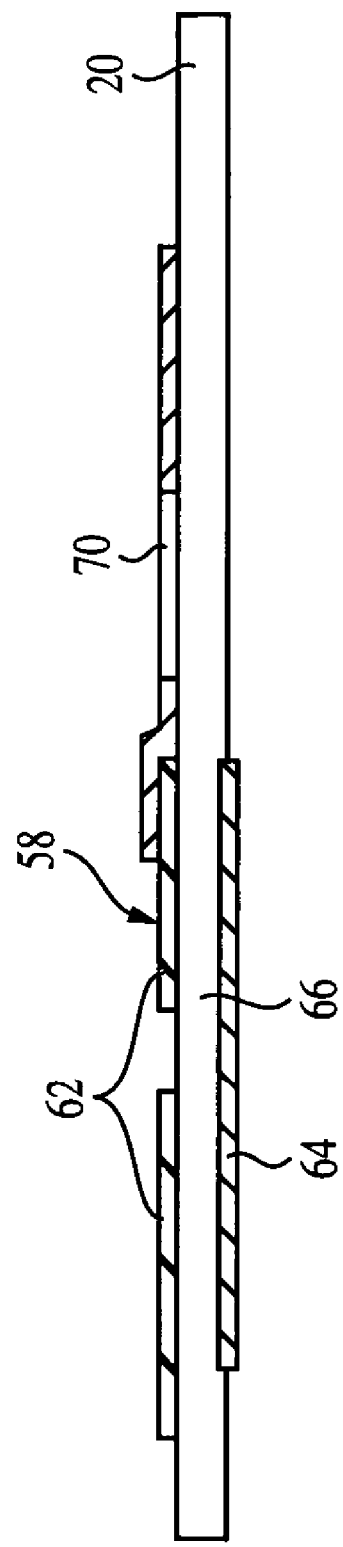
FIG. 10 is a schematic cross-section of an embodiment of an RC circuit fabricated in accordance with another embodiment of the present invention.

FIGS. 8 and 9 show a printed RC circuit 56 produced in accordance with an embodiment of the present invention. An RC circuit 56 include a capacitor 58 which is formed on one side of the substrate 20 with a dielectric 60 provided between two electrodes 62, 64 (best shown in FIG. 9) in a manner similar to an embodiment described above. Alternatively, as shown in FIG. 10, the capacitor 58 can be formed by depositing the electrodes 62, 64 on both sides of the substrate 20 using an embodiment of the inkjet printing method similar to that which was described above with respect to the RF resonant circuit 48 shown in FIG. 6. In this embodiment, the portion of the substrate 20 between the two electrodes 62, 64 acts as a dielectric 66.

A resistor portion 70 of the RC circuit 56 is formed by inkjet depositing carbon particles suspend in print fluid. Overlapping the carbon particles over the silver (or vice versa) makes the connection between the resistor 70 and the capacitor 58. The connection can also be made by mixing the silver and carbon particles at the connection point while the print fluid is still uncured, i.e. prior to heating. The factors which determine the resistance of the resistor 70 may include the resistivity of the resistor material used (for example, carbon particles), the cross sectional area of the resistor, contact areas, contact resistivities, and the overall length of the resistor.

Figure 11:
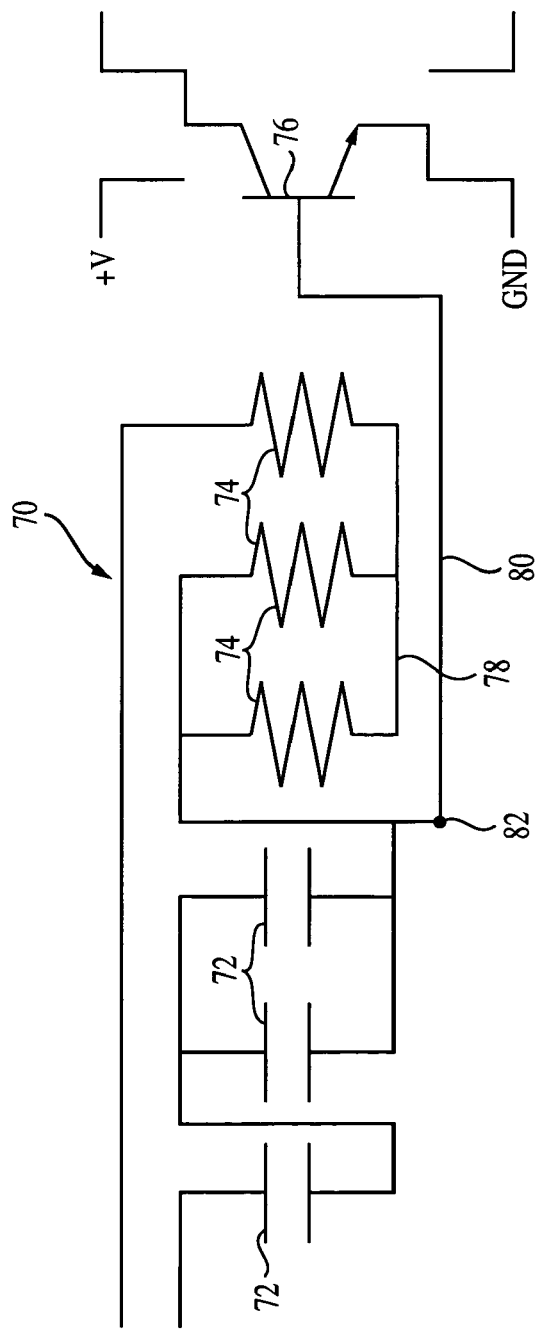
FIG. 11 is a diagram of an embodiment of a circuit illustrating the customizing capabilities of an embodiment of the present invention.
Figure 12:
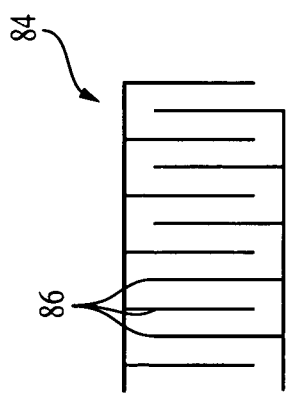
FIG. 12 is an embodiment of a capacitor for illustrating the capacitance changing capabilities in accordance with an embodiment of the present invention.
Figure 13:
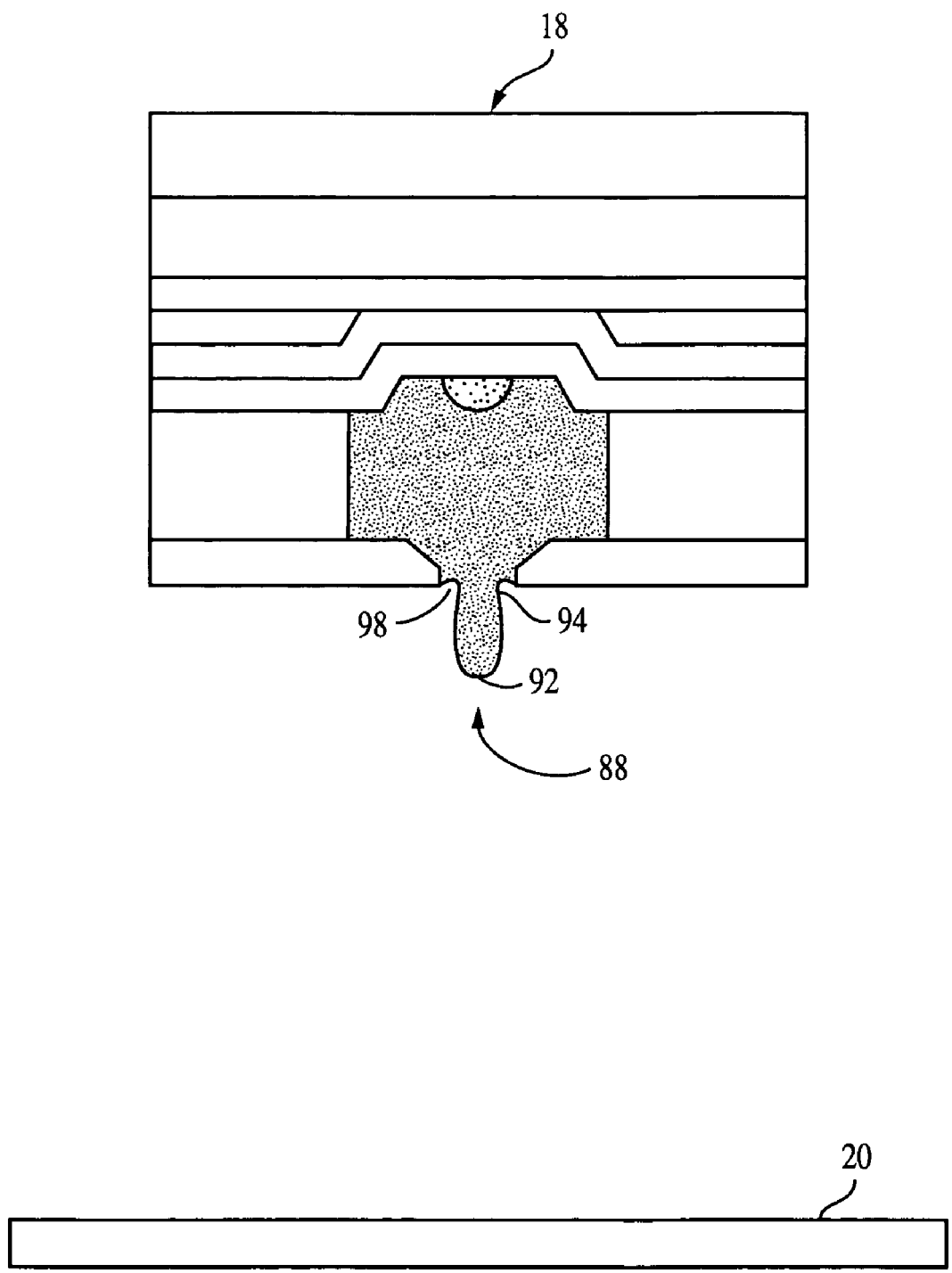
Figure 15:
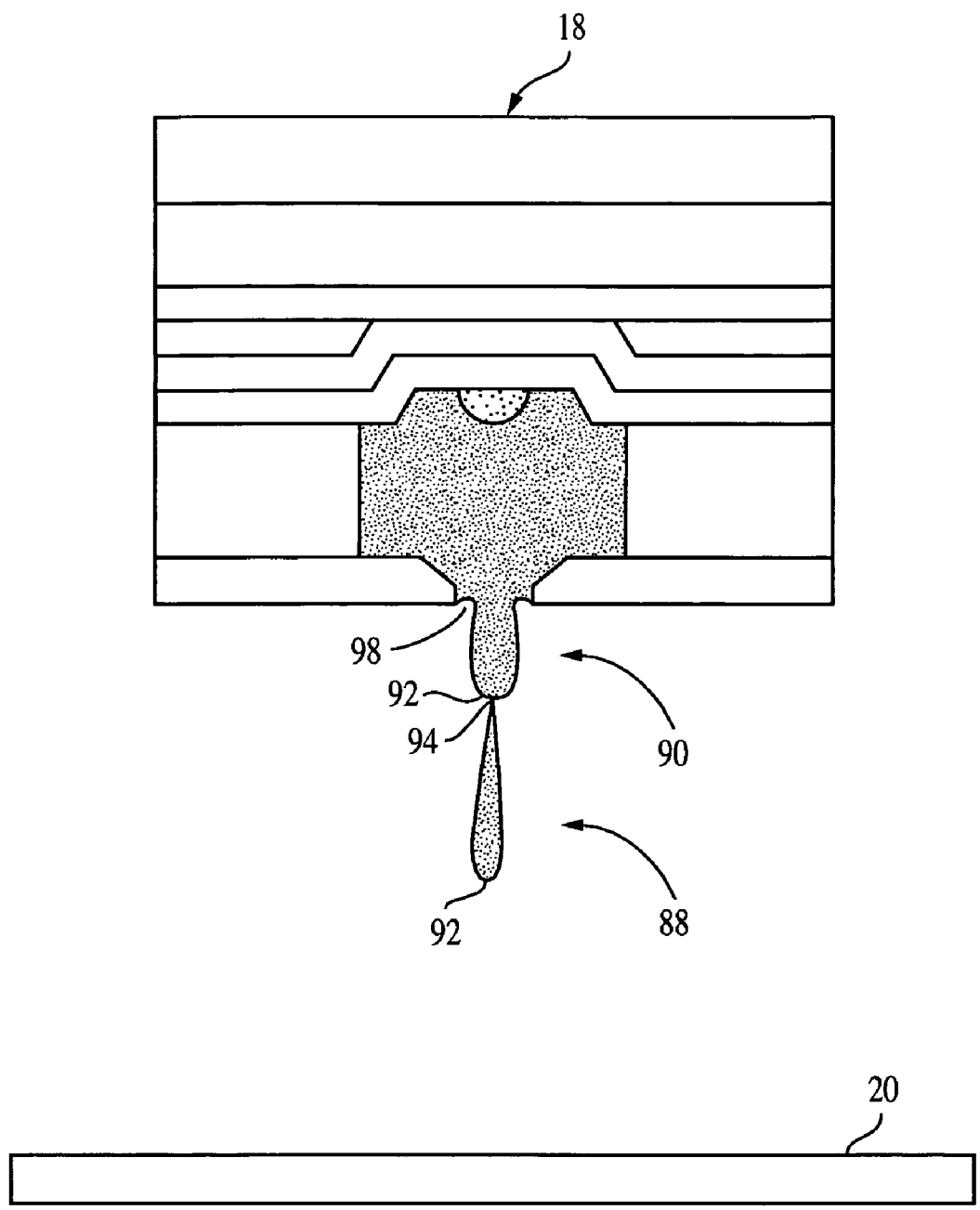

FIGS. 11-12 show exemplary embodiments of the invention for customizing electrical circuits and components. In FIG. 11, a circuit 70 includes a number of pre-existing components (three capacitors 72, three resistors 74 and a transistor 76), which may have been previously fabricated either by methods such as screen printing, pad printing, etc., or by the embodiments of the inkjet deposition methods described above. In accordance with an embodiment of the invention, the controller 12 (best shown in FIGS. 1 and 2) is programmed to control the print head 18 to connect the components of the circuit 70 in a desired arrangement, i.e., customize, for a particular purpose. In FIG. 11, print fluid containing conductive metal nanoparticles is deposited onto the circuit as a connection line 78 to connect the three resistors 74 and as a connection line 80 to connect a node 82 to the transistor 76.

In another exemplary embodiment shown in FIG. 12, the capacitance of a high frequency capacitor 84 is customized by adding interdigitated fingers 86, or by changing the area and proximity thereof. Using the embodiments of the inkjet deposition methods described above, dielectric material may be printed between the interdigitated fingers to control the resulting capacitance. Those skilled in the art will recognize that this capability could be very useful in programming Radio Frequency Identification or other radio circuits for different frequencies.

Whether the embodiments of the present inkjet printer 10 are a thermal or a piezoelectric type, the print head 18 dispenses print fluid in a single ligament of fluid. As used in this specification, the term "ligament" is meant to be understood broadly as any united or substantially continuous flow of dispensed fluid. As a way of example, FIGS. 13-16 illustrate one embodiment of dispensing a single ligament of fluid on the substrate 20 using a thermal inkjet printer 10. The process begins by firing a first quantity of print fluid 88 from the print head 18 (best shown in FIG. 13). Once the first quantity of fluid 88 has been fired, the print head 18 fires a second quantity of fluid 90 at a frequency sufficient that a head portion 92 of the second quantity of fluid 90 "catches" the tail portion 94 of the first quantity of fluid 88 (best shown in FIG. 15).

In some modes of operation of a thermal inkjet there may be a gap 96 between the tail portion 94 of a previously formed quantity of fluid and the head portion 92 of a subsequently formed quantity of fluid 90 (best shown in FIG. 14). One factor that may be adjusted to aid in the subsequently formed quantity of fluid "catching" the tail of the previously formed quantity of fluid is the firing frequency of subsequent quantities of fluid. The firing frequency of subsequent quantities of fluid may be adjusted in order to close the gap 96 created between the tail portion 94 of the previously ejected quantity of fluid and the head portion 92 of the subsequently formed quantity of fluid.

Once the first quantity of fluid 88 has been ejected from the thermal print head 18, the speed of the ejected quantity of fluid generally plateaus off. However, as the first quantity of fluid 88 is ejected towards the substrate 20, a stretching phenomenon occurs. This stretching phenomenon is caused as the tail portion 94 of the first quantity of fluid 88 clings to an orifice region 98 from which it was ejected due to surface tension. This surface tension applies a force upon the tail portion 94 of the first quantity of fluid 88 resulting in the tail portion 94 traveling at a relatively slower velocity than the head portion 92. This relative difference in velocity between the head portion 92 and the tail portion 94 causes the first quantity of fluid 88 to stretch out thereby aiding in the formation of a single ligament of fluid.

Figure 16:
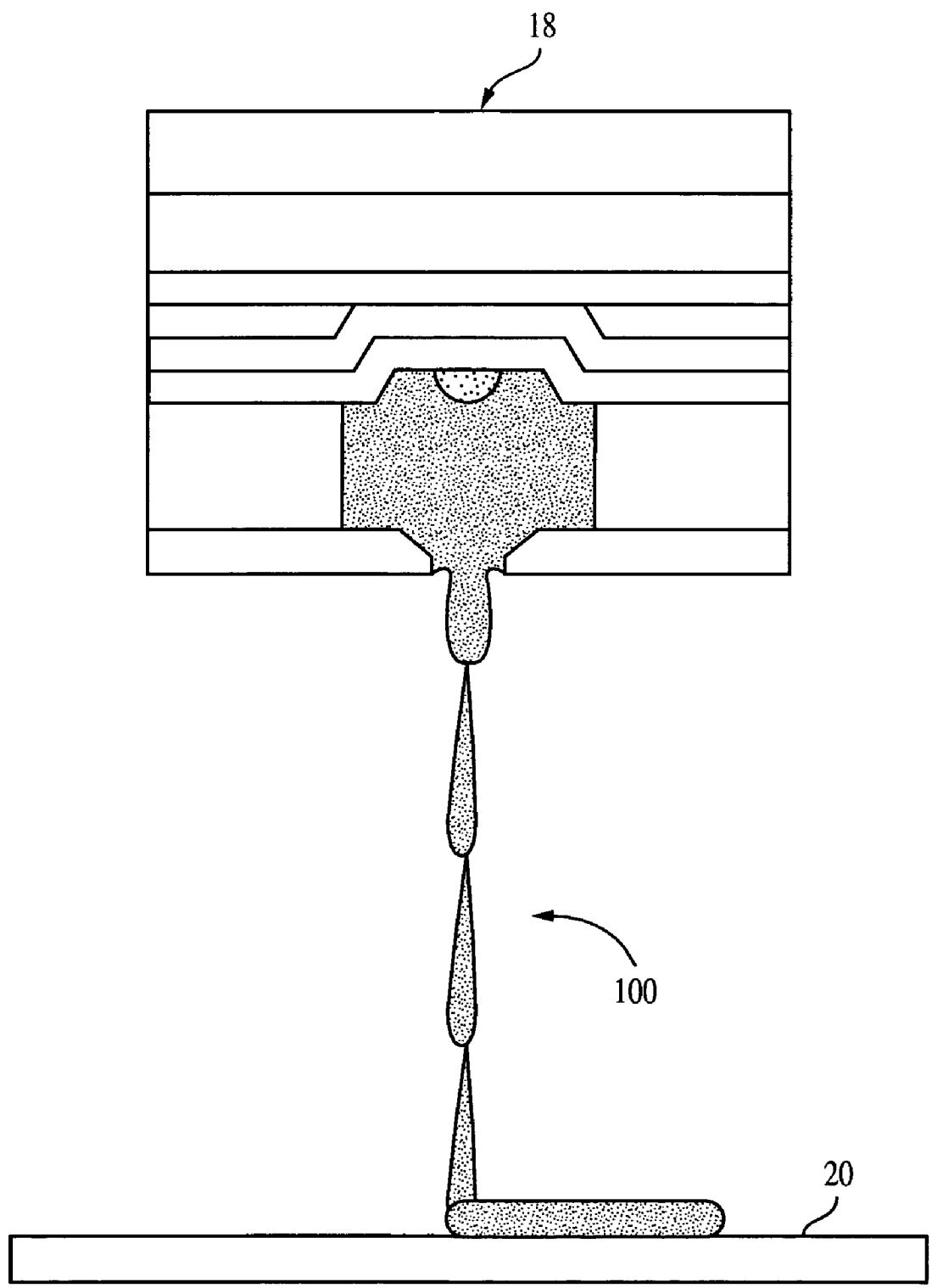

Once two or more quantities of print fluid have been fired from the print head 18 and the gap 96 between the tail portion 94 of previously ejected quantities of fluid and the head portion 92 of subsequently ejected quantities of fluid has been eliminated, the individual quantities of material form a single ligament of fluid 100 translating toward a substrate 20, as shown in FIG. 16. Simultaneous with the ejection of fluid and the deposition of the single fluid ligament 100 on the substrate 20, the print head 18 may be translated to selectively deposit the fluid.

While the process for forming a single ligament of fluid 100 was illustrated in the context of a thermal inkjet printer 10, this process may also be incorporated into piezoelectric type inkjet printers. With piezoelectric printheads the parameters controlling the ejection can be adjusted so that a continuous ligament emerges from the orifice rather than individual ligaments merging in flight. Moreover, the print head 18 may eject discrete droplets of fluid onto a print media at designated locations, rather than a single ligament (or continuous stream) of fluid. The locations for the discrete droplets are chosen such that the droplets approximate a continuous line. A more detailed description of the single fluid ligament dispensing method and additional embodiments thereof using a piezoelectric or a thermal inkjet print head 18 are provided in commonly assigned U.S. patent application Ser. No. 10/685,842, filed Oct. 14, 2003, entitled A METHOD AND A SYSTEM FOR SINGLE LIGAMENT FLUID DISPENSING, now U.S. Pat. No. 7,219,970, the subject matter of which application is incorporated herein in its entirety.

While specific embodiments of the present invention have been shown and described, it should be understood that other modifications, substitutions and alternatives are apparent to one of ordinary skill in the art. Such modifications, substitutions and alternatives can be made without departing from the spirit and scope of the subject matter of the appended claims.

The invention claimed is:

1. An apparatus to fabricate a circuit, comprising:
  means for supplying a fluid, including materials for forming the circuit, the fluid including the materials stored and supplied by the means for supplying the fluid, wherein the fluid including the materials stored and supplied by the means for supplying fluid comprises electrically conductive metal nanoparticles;
  a print head to receive the fluid including the materials supplied by the means for supplying the fluid and to eject the fluid including the materials from the means for supplying fluid in a single ligament on a substrate to deposit the fluid including the materials onto the substrate in a pattern comprising at least a portion of the circuit;
  means for heating the fluid including the materials to evaporate the fluid and bond the materials to the substrate; and
  a controller to control the print head and the means for supplying the fluid to eject the fluid in the pattern, the controller to control the print head during the depositing of a continuous pattern to adjust the speed of the fluid ejection of each quantity of fluid from the print head such that a subsequently formed quantity of fluid merges with a previously formed quantity of fluid before contacting the substrate to form the single ligament.

2. The apparatus as defined in claim 1, wherein the means for heating includes a configuration to sinter the materials after the materials are deposited on the substrate.

3. The apparatus as defined in claim 1, wherein the means for heating includes a configuration to at least one of evaporate or dry the fluid from the materials.

4. The apparatus as defined in claim 1, further including means for supplying the substrate to the print head.

5. The apparatus as defined in claim 1, wherein the print head comprises a thermal print head.

6. The apparatus as defined in claim 1, wherein the print head comprises a piezoelectric print head.

7. The apparatus as defined in claim 1, wherein the metal nanoparticles comprise at least one of silver, copper, nickel, aluminum or gold.

8. The apparatus as defined in claim 1, wherein the materials stored and supplied by the means for supplying fluid comprise electrically insulating polymers.

9. The apparatus as defined in claim 1, wherein said the fluid including said the materials comprises electrically resistive particles.

10. The apparatus as defined in claim 9, wherein said the resistive particles comprise carbon particles.

11. The apparatus as defined in claim 1, wherein the means for heating comprises at least one of a convection oven, a laser energy source, a microwave energy source or a direct infrared source.

12. The apparatus as defined in claim 1, wherein the substrate is flexible.

13. The apparatus as defined in claim 12, wherein the substrate comprises at least one of paper or plastic.

14. The apparatus as defined in claim 1, wherein said the substrate is rigid.

15. The apparatus as defined in claim 1, wherein the substrate is glass.

16. An apparatus to fabricate a circuit, comprising:
  means for supplying a fluid, including materials for forming the circuit, the fluid including the materials stored and supplied by the means for supplying the fluid, wherein the fluid including the materials stored and supplied by the means for supplying fluid comprises electrically conductive polymers;
  a print head to receive the fluid including the materials supplied by the means for supplying the fluid and to eject the fluid including the materials from the means for supplying the fluid in a single ligament on a substrate to deposit the fluid including the materials onto the substrate in a pattern comprising at least a portion of the circuit;
  means for heating the fluid including the materials to evaporate the fluid and bond the materials to the substrate; and
  a controller to control the print head and the means for supplying the fluid to eject the fluid in the pattern, the controller to control the print head during the depositing of a continuous pattern to adjust the speed of fluid ejection of each quantity of fluid from the print head such that a subsequently formed quantity of fluid merges with a previously formed quantity of fluid before contacting the substrate to form the single ligament.

17. The apparatus as defined in claim 16, wherein the polymers comprise at least one of PEDOT or polyaniline.

18. The apparatus as defined in claim 17, wherein the insulating polymers comprise at least one of polyvinyl pyrrolidone or polyvinyl phenol.

19. The apparatus as defined in claim 16, wherein the means for heating includes a configuration to sinter the materials after the materials are deposited on the substrate.

20. The apparatus as defined in claim 16, wherein the means for heating includes a configuration to at least one of evaporate or dry the fluid from the materials.

21. The apparatus as defined in claim 16, further including means for supplying the substrate to the print head.

22. The apparatus as defined in claim 16, wherein the print head comprises a thermal print head.

23. The apparatus as defined in claim 16, wherein the print head comprises a piezoelectric print head.

24. The apparatus as defined in claim 16, wherein the materials stored and supplied by the means for supplying fluid comprise electrically insulating polymers.

25. The apparatus as defined in claim 16, wherein the fluid including the materials comprises electrically resistive particles.

26. The apparatus as defined in claim 16, wherein the means for heating comprises at least one of a convection oven, a laser energy source, a microwave energy source or a direct infrared source.

27. The apparatus as defined in claim 16, wherein the substrate is flexible.

28. The apparatus as defined in claim 16, wherein the substrate is rigid.

29. The apparatus as defined in claim 16, wherein the substrate is glass.

30. An apparatus to fabricate a circuit, comprising:
  means for supplying a fluid, including materials for forming the circuit, the fluid including the materials stored and supplied by the means for supplying the fluid, wherein the fluid including the materials comprises dielectric polymers;

a print head to receive the fluid including the materials supplied by the means for supplying the fluid and to eject the fluid including the materials from the means for supplying the fluid in a single ligament on a substrate to deposit the fluid including the materials onto the substrate in a pattern comprising at least a portion of the circuit;

means for heating the fluid including the materials to evaporate the fluid and bond the materials to the substrate; and a controller to control the print head and the means for supplying the fluid to eject the fluid in the pattern, the controller to control the print head during the depositing of a continuous pattern to adjust the speed of fluid ejection of each quantity of fluid from the print head such that a subsequently formed quantity of fluid merges with a previously formed quantity of fluid before contacting the substrate to form the single ligament.

31. The apparatus as defined in claim 30, wherein said the dielectric polymers comprise at least one of polyvinyl pyrrolidone or polyvinyl phenol.

32. The apparatus as defined in claim 30, wherein the means for heating includes a configuration to sinter the materials after the materials are deposited on the substrate.

33. The apparatus as defined in claim 30, wherein the means for heating includes a configuration to at least one of evaporate or dry the fluid from the materials.

34. The apparatus as defined in claim 30, further including means for supplying the substrate to the print head.

35. The apparatus as defined in claim 30, wherein the print head comprises a thermal print head.

36. The apparatus as defined in claim 30, wherein the print head comprises a piezoelectric print head.

37. The apparatus as defined in claim 30, wherein the materials stored and supplied by the means for supplying fluid comprise electrically insulating polymers.

38. The apparatus as defined in claim 30, wherein the fluid including the materials comprises electrically resistive particles.

39. The apparatus as defined in claim 30, wherein the means for heating comprises at least one of a convection oven, a laser energy source, a microwave energy source or a direct infrared source.

40. The apparatus as defined in claim 30, wherein the substrate is flexible.

41. The apparatus as defined in claim 30, wherein the substrate is rigid.

42. The apparatus as defined in claim 30, wherein the substrate is glass.

43. An apparatus to fabricate a circuit, comprising:

means for supplying a fluid, including materials for forming the circuit, the fluid including the materials stored and supplied by the means for supplying the fluid, wherein the fluid including the materials comprises alpha-terpineol mixed with ethanol or toluene;

a print head to receive the fluid including the materials supplied by the means for supplying the fluid and to eject the fluid including the materials from the means for supplying the fluid in a single ligament on a substrate to deposit the fluid including the materials onto the substrate in a pattern comprising at least a portion of the circuit;

means for heating the fluid including the materials to evaporate the fluid and bond the materials to the substrate; and a controller to control the print head and the means for supplying the fluid to eject the fluid in the pattern, the controller to control the print head during the depositing of a continuous pattern to adjust the speed of fluid ejection of each quantity of fluid from the print head such that a subsequently formed quantity of fluid merges with a previously formed quantity of fluid before contacting the substrate to form the single ligament.

44. The apparatus as defined in claim 43, wherein the means for heating includes a configuration to sinter the materials after the materials are deposited on the substrate.

45. The apparatus as defined in claim 43, wherein the means for heating includes a configuration to at least one of evaporate or dry the fluid from the materials.

46. The apparatus as defined in claim 43, further including means for supplying the substrate to the print head.

47. The apparatus as defined in claim 43, wherein the print head comprises a thermal print head.

48. The apparatus as defined in claim 43, wherein the print head comprises a piezoelectric print head.

49. The apparatus as defined in claim 43, wherein the materials stored and supplied by the means for supplying fluid comprise electrically insulating polymers.

50. The apparatus as defined in claim 43, wherein the fluid including the materials comprises electrically resistive particles.

51. The apparatus as defined in claim 43, wherein the means for heating comprises at least one of a convection oven, a laser energy source, a microwave energy source or a direct infrared source.

52. The apparatus as defined in claim 43, wherein the substrate is flexible.

53. The apparatus as defined in claim 43, wherein the substrate is rigid.

54. The apparatus as defined in claim 43, wherein the substrate is glass.

55. An apparatus to form a circuit, comprising:

at least one fluid tank containing a fluid including materials to form at least a portion of a circuit, wherein the fluid including the materials comprises electrically conductive metal nanoparticles;

a print head to receive the fluid including the materials from the at least one fluid tank and to eject the fluid including the materials in a single ligament to deposit the fluid and the materials onto a substrate in a pattern comprising at least a portion of the circuit;

a media supply to supply and position the substrate relative to the printhead;

a heating device to heat the fluid including the materials on the substrate to evaporate the fluid and bond the materials to the substrate; and a controller to control the print head, the media supply and the heating device to form at least a portion of the circuit, the controller to control the print head during the depositing of a continuous pattern to adjust the speed of fluid ejection of each quantity of fluid from the print head such that a subsequently formed quantity of fluid merges with a previously formed quantity of fluid before contacting the substrate to form the single ligament.

56. The apparatus as defined in claim 55, wherein the print head comprises a thermal inkjet print head.

57. The apparatus as defined in claim 55, wherein the print head comprises a piezoelectric inkjet print head.

58. The apparatus as defined in claim 55, wherein the heating device includes a configuration to sinter the materials after the materials are deposited on the substrate.

59. The apparatus as defined in claim 55, wherein the metal nanoparticles comprise at least one of silver, copper, nickel, aluminum or gold.

60. The apparatus as defined in claim 55, wherein the fluid including said the materials comprise electrically insulating polymers.

61. The apparatus as defined in claim 55, wherein the fluid including the materials comprise electrically resistive particles.

62. The apparatus as defined in claim 61, wherein the resistive particles comprise carbon.

63. An apparatus to form a circuit, comprising:
- at least one fluid tank containing a fluid including materials to form at least a portion of a circuit, wherein the fluid including the materials comprises electrically conductive polymers;
- a print head to receive the fluid including the materials from the at least one fluid tank and to eject the fluid including the materials in a single ligament to deposit the fluid and the materials onto a substrate in a pattern comprising at least a portion of the circuit;
- a media supply to supply and position the substrate relative to the printhead;
- a heating device to heat the fluid including the materials on the substrate to evaporate the fluid and bond the materials to the substrate; and
- a controller to control the print head, the media supply and the heating device to form at least a portion of the circuit, the controller to control the print head during the depositing of a continuous pattern to adjust the speed of fluid ejection of each quantity of fluid from the print head such that a subsequently formed quantity of fluid merges with a previously formed quantity of fluid before contacting the substrate to form the single ligament.

64. The apparatus as defined in claim 63, wherein the polymers comprise at least one of PEDOT or polyaniline.

65. The apparatus as defined in claim 63, wherein the print head comprises a thermal inkjet print head.

66. The apparatus as defined in claim 63, wherein the print head comprises a piezoelectric inkjet print head.

67. The apparatus as defined in claim 63, wherein the heating device includes a configuration to sinter the materials after the materials are deposited on the substrate.

68. The apparatus as defined in claim 63, wherein the fluid including the materials comprise electrically insulating polymers.

69. The apparatus as defined in claim 63, wherein the fluid including the materials comprise electrically resistive particles.

70. An apparatus to form a circuit, comprising:
- at least one fluid tank containing a fluid including materials to form at least a portion of a circuit, wherein the fluid including the materials comprises at least one of polyvinyl pyrrolidone or polyvinyl phenol;
- a print head to receive the fluid including the materials from the at least one fluid tank and to eject the fluid including the materials in a single ligament to deposit the fluid and the materials onto a substrate in a pattern comprising at least a portion of the circuit;
- a media supply to supply and position the substrate relative to the printhead;
- a heating device to heat the fluid including the materials on the substrate to evaporate the fluid and bond the materials to the substrate; and
- a controller to control the print head, the media supply and the heating device to form at least a portion of the circuit, the controller to control the print head during the depositing of a continuous pattern to adjust the speed of fluid ejection of each quantity of fluid from the print head such that a subsequently formed quantity of fluid merges with a previously formed quantity of fluid before contacting the substrate to form the single ligament.

71. The apparatus as defined in claim 70, wherein the print head comprises a thermal inkjet print head.

72. The apparatus as defined in claim 70, wherein the print head comprises a piezoelectric inkjet print head.

73. The apparatus as defined in claim 70, wherein the heating device includes a configuration to sinter the materials after the materials are deposited on the substrate.

74. The apparatus as defined in claim 70, wherein the fluid including the materials comprise electrically insulating polymers.

75. The apparatus as defined in claim 70, wherein the fluid including the materials comprise electrically resistive particles.

76. An apparatus to form a circuit, comprising:
- at least one fluid tank containing a fluid including materials to form at least a portion of a circuit, wherein the fluid including the materials comprises dielectric polymers;
- a print head to receive the fluid including the materials from the at least one fluid tank and to eject the fluid including the materials in a single ligament to deposit the fluid and the materials onto a substrate in a pattern comprising at least a portion of the circuit;
- a media supply to supply and position the substrate relative to the printhead;
- a heating device to heat the fluid including the materials on the substrate to evaporate the fluid and bond the materials to the substrate; and
- a controller to control the print head, the media supply and the heating device to form at least a portion of the circuit, the controller to control the print head during the depositing of a continuous pattern to adjust the speed of fluid ejection of each quantity of fluid from the print head such that a subsequently formed quantity of fluid merges with a previously formed quantity of fluid before contacting the substrate to form the single ligament.

77. The apparatus as defined in claim 76, wherein the dielectric polymers comprise at least one of polyvinyl pyrrolidone or polyvinyl phenol.

78. The apparatus as defined in claim 76, wherein the print head comprises a thermal inkjet print head.

79. The apparatus as defined in claim 76, wherein the print head comprises a piezoelectric inkjet print head.

80. The apparatus as defined in claim 76, wherein the heating device includes a configuration to sinter the materials after the materials are deposited on the substrate.

81. The apparatus as defined in claim 76, wherein the fluid including the materials comprise electrically insulating polymers.

82. The apparatus as defined in claim 76 wherein the fluid including the materials comprise electrically resistive particles.

83. An apparatus to form a circuit, comprising:
- at least one fluid tank containing a fluid including materials to form at least a portion of a circuit, wherein the fluid including the materials comprises at least one of alpha-terpineol mixed with ethanol or toluene;
- a print head to receive the fluid including the materials from the at least one fluid tank and to eject the fluid including the materials in a single ligament to deposit the fluid and the materials onto a substrate in a pattern comprising at least a portion of the circuit;

a media supply to supply and position the substrate relative to the printhead;

a heating device to heat the fluid including the materials on the substrate to evaporate the fluid and bond the materials to the substrate; and a controller to control the print head, the media supply and the heating device to form at least a portion of the circuit, the controller to control the print head during the depositing of a continuous pattern to adjust the speed of fluid ejection of each quantity of fluid from the print head such that a subsequently formed quantity of fluid merges with a previously formed quantity of fluid before contacting the substrate to form the single ligament.

84. The apparatus as defined in claim 83, wherein the print head comprises a thermal inkjet print head.

85. The apparatus as defined in claim 83, wherein the print head comprises a piezoelectric inkjet print head.

86. The apparatus as defined in claim 83, wherein the heating device includes a configuration to sinter the materials after the materials are deposited on the substrate.

87. The apparatus as defined in claim 83, wherein the fluid including the materials comprise electrically insulating polymers.

88. The apparatus as defined in claim 83, wherein the fluid including the materials comprise electrically resistive particles.

* * * * *

UNITED STATES PATENT AND TRADEMARK OFFICE
CERTIFICATE OF CORRECTION

PATENT NO. : 7,757,631 B2  Page 1 of 1
APPLICATION NO. : 10/854450
DATED : July 20, 2010
INVENTOR(S) : John A. Devos et al.

It is certified that error appears in the above-identified patent and that said Letters Patent is hereby corrected as shown below:

In column 7, line 55, in Claim 9, after "wherein" delete "said".

In column 7, line 56, in Claim 9, after "including" delete "said".

In column 7, line 58, in Claim 10, after "wherein" delete "said".

In column 8, line 1, in Claim 14, after "wherein" delete "said".

In column 9, line 22, in Claim 31, after "wherein" delete "said".

In column 11, line 8, in Claim 60, after "including" delete "said".

Signed and Sealed this

Sixteenth Day of November, 2010

David J. Kappos
*Director of the United States Patent and Trademark Office*